(12) United States Patent
Szapucki et al.

(10) Patent No.: US 6,244,641 B1
(45) Date of Patent: Jun. 12, 2001

(54) WAFER TRANSFER ARM

(75) Inventors: Matthew Peter Szapucki, Toms River; Richard Kulkaski, Forked River; Trevor J. Hadley, Brick; Mark Anthony Santorelli, Barnegat, all of NJ (US)

(73) Assignee: M.E.C. Technology, Inc., Toms River, NJ (US)

( * ) Notice: Subject to any disclaimer, the term of this patent is extended or adjusted under 35 U.S.C. 154(b) by 0 days.

(21) Appl. No.: 09/453,271

(22) Filed: Dec. 2, 1999

(51) Int. Cl.[7] .............................. B25J 15/06; B65G 49/07
(52) U.S. Cl. ..................................... 294/64.1; 414/941
(58) Field of Search ........................... 294/64.1, 64.2, 294/64.3, 65; 901/40; 414/935–941

(56) References Cited

U.S. PATENT DOCUMENTS

| | | | |
|---|---|---|---|
| 3,517,958 | * 6/1970 | Boucher et al. | 294/64.1 |
| 4,428,815 | * 1/1984 | Powell et al. | 294/64.1 |
| 4,653,741 | * 3/1987 | Palmer | 294/64.1 |
| 5,324,155 | * 6/1994 | Goodwin et al. | 414/941 |
| 5,915,910 | * 6/1999 | Howells et al. | 414/941 |

* cited by examiner

Primary Examiner—Dean J. Kramer
(74) Attorney, Agent, or Firm—Kenneth Watov

(57) ABSTRACT

A wafer transfer arm made from a machineable material for picking up and delivering a semiconductor wafer from one location to another, includes a blade body with a longitudinal channel extending along one surface, and a coverplate adapted to matingly fit into the channel for defining a vacuum conduit therein. The vacuum conduit provides fluid communication between an inlet at one end of the blade body and an outlet at the other end, for suctionally retaining the semiconductor wafer by vacuum pressure or suction.

37 Claims, 13 Drawing Sheets

WAFER TRANSFER ARM

FIELD OF THE INVENTION

The present invention relates generally to integrated circuit manufacture, and more particularly to arms for transferring substrates, specifically vacuum-assisted arms used to pick up and transfer semiconductor wafers between storage and processing systems.

BACKGROUND OF THE INVENTION

Semiconductor wafers are typically processed in specialized processing systems. These systems include one or more chambers, each performing wafer processing operations such as etching, chemical vapor deposition or physical vapor deposition, which often require heating or cooling of the wafer, and a plasma to assist the process. Each chamber includes inlets and outlets for admission and evacuation of processing gases, as well as an aperture controlled by a slit valve to admit wafers. Such processing chambers may in turn communicate with a wafer transfer chamber, and in turn the transfer chamber will have a valve-controlled aperture by which wafers can be admitted from outside the system. Importantly, the fabrication of semiconductors and the handling of silicon wafers requires exceptional cleanliness. Therefore, the environment within such processing chambers and storage areas must be maintained virtually free of dust and contaminants. In order to minimize risk of contamination, the transfer of a wafer to and from a chamber and to and from the outside of the system is generally done mechanically by means of a robot arm at the end of which is a wafer retaining means.

Semiconductor wafers are typically stored in a wafer storage cassette that retains a plurality of wafers vertically in a spaced apart relationship. One standard type of wafer retaining means used in the art includes a flat blade-like arm through which a vacuum conduit is formed, terminating in an outlet. This is so that the arm can pick up a wafer by touching the surface containing the outlet, typically the upper surface of the arm, to the bottom surface of the wafer and applying a vacuum, so as to cause the wafer to stick to the arm. The vacuum-held wafer is securely retained to the arm as the robot arm swings around to deliver the wafer to another location. The advantage of the flat vacuum arm pickup is that the arm, being flat and thin, can be relatively easily maneuvered between the closely spaced wafers in a wafer storage cassette to retrieve and transfer a wafer therefrom.

Prior art wafer transfer arms are typically constructed as a solid, unitary member comprised of a durable heat resistant material such as a metal, plastic, or ceramic, for example, or as a multi layer laminate of metal and plastic bonded together with silicone rubber or some other appropriate adhesive.

Prior art wafer transfer arms are typically fashioned by cutting a longitudinal channel along a surface of the arm and adhesively attaching a thin plastic film covering comprising, for example, a polyamide material, to the surface for sealing the channel to form a gas-tight conduit between a vacuum outlet and inlet of opposing ends of the arm, respectively. However, such wafer transfer arms manifest limited useful lives and often suffer from critical disadvantages as will be explained hereinafter.

One drawback associated with prior art wafer transfer arms, is premature wear and deterioration. During normal operation, the arm is typically exposed to high temperature, corrosive conditions created by the presence of wafer processing gases and liquids, and stress associated with the cycling of subatmospheric pressures within the arm. The unfavorable conditions greatly impact the thin plastic film covering, herein referred to as the "coverplate", frequently resulting in rapid deterioration and detachment from the surface of the arm. As the coverplate peels back, the loose end poses a danger of scratching the delicate surface of a neighboring wafer during retrieval, ruining the whole wafer. The loosened or damaged coverplate may also lead to a total or partial loss of vacuum in the arm, thereby compromising the wafer retaining capability and resulting in the dropping and loss of retrieved wafers.

Another serious drawback associated with the prior art wafer transfer arms is the tendency of the arm to crack or break unexpectedly during normal use. The wafer transfer arm's thin profile and the longitudinal channel severely diminishes the tensile strength of the arm resulting in abrupt structural fatigue and failure. Moreover, the thin film coverplate affixed to the surface of the arm contributes little or none to the overall structural integrity of the arm. Such failures are unacceptable and costly in semiconductor wafer processing systems.

For the foregoing reasons, there is a need for an improved device, that is durable, reliable, and long-lasting while remaining simple and cost effective to fabricate. Also very desirable would be a wafer transfer arm that consistently assures proper holding and centering of the wafer under various conditions and environments encountered during wafer transferral. It would also be very advantageous to provide a wafer transfer arm that can withstand corrosive substances, elevated temperatures, and repeated cycling of subatmospheric pressures for retaining, for example, silicon wafers. The foregoing capabilities would be still more desirable if provided with a thin profile wafer transfer arm with the capability of smoothly accessing individual wafers between the tight spaces of standard wafer storage cassettes, and which the arm incorporates a vacuum conduit means for retrieving and retaining the wafers.

SUMMARY OF THE INVENTION

The present invention is generally directed to an improved wafer transfer arm comprised of a flat blade-like body for picking up and carrying a semiconductor wafer from one location to another, and means for forming a vacuum conduit therethrough in a practical manner which provides the benefits of durability, strength, and reliability, yet maintaining a cost effective and efficient means of fabrication.

In particular, one aspect of the present invention is directed to a wafer transfer arm comprising:

a blade having first and second ends, top and bottom portions, said first end being configured for attachment to a wafer transfer apparatus;

said top portion of said blade including a top surface being configured for receiving a substrate wafer thereon, and a suctional mechanism proximate said second end being configured for releasable retainment of said substrate wafer;

a longitudinal channel extending along said bottom portion from said first end to said second end, said channel being in fluid communication with said suctional mechanism;

a coverplate being configured for a flush sealed fit along a top portion of said channel to form a vacuum conduit therein, said coverplate having a vacuum outlet proximate said first end of said blade, said vacuum outlet being configured for fluid coupling with a vacuum-generating mechanism; and an affixing mechanism for securably affixing said coverplate to said blade.

BRIEF DESCRIPTION OF THE DRAWINGS

Various embodiments of the invention are described in detail below with reference to the drawings, in which like items are identified by the same reference designation, wherein.

DETAILED DESCRIPTION OF THE INVENTION

The present invention is generally directed to a wafer transfer arm constructed in a manner that provides an improved structural configuration for picking up and carrying semiconductor wafers from one location to another. The wafer transfer arm is constructed with the advantage of enjoying the cost efficiency and effectiveness associated with flat, blade-like vacuum-assisted arms while possessing an improved strength, durability and reliability especially suitable over prior art wafer transfer arms for use in semiconductor wafer processing systems.

Figure 1:
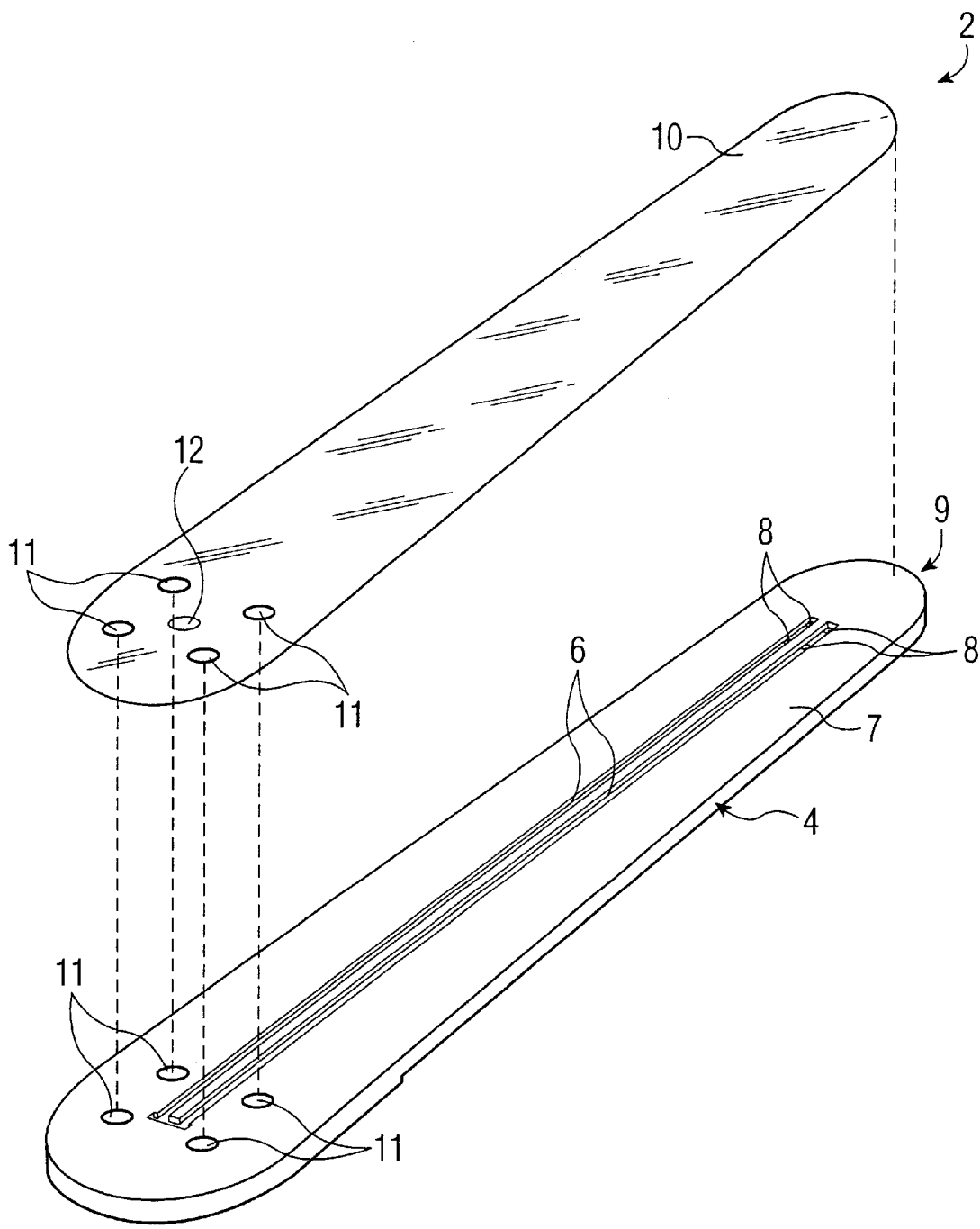
FIG. 1 is an exploded assembly view looking toward the bottom of a prior art wafer transfer arm.

As shown in FIG. 1, a wafer transfer arm 2 of the prior art includes a flat, blade-like body 4 with a pair of channels 6 arranged along a bottom surface 7, each channel 6 terminating in a plurality of vacuum outlets 8 at the distal end 9, and a coverplate 10 adhesively affixed to the body 4 for defining a vacuum conduit between the vacuum outlets 8 and a vacuum inlet 12. Proximate the vacuum inlet 12 are a plurality of mounting holes 11 for securing the transfer arm 2 to known wafer transfer apparatuses. The coverplate 10 is typically a thin plastic film covering comprising, for example, a polyamide material.

Figure 2:
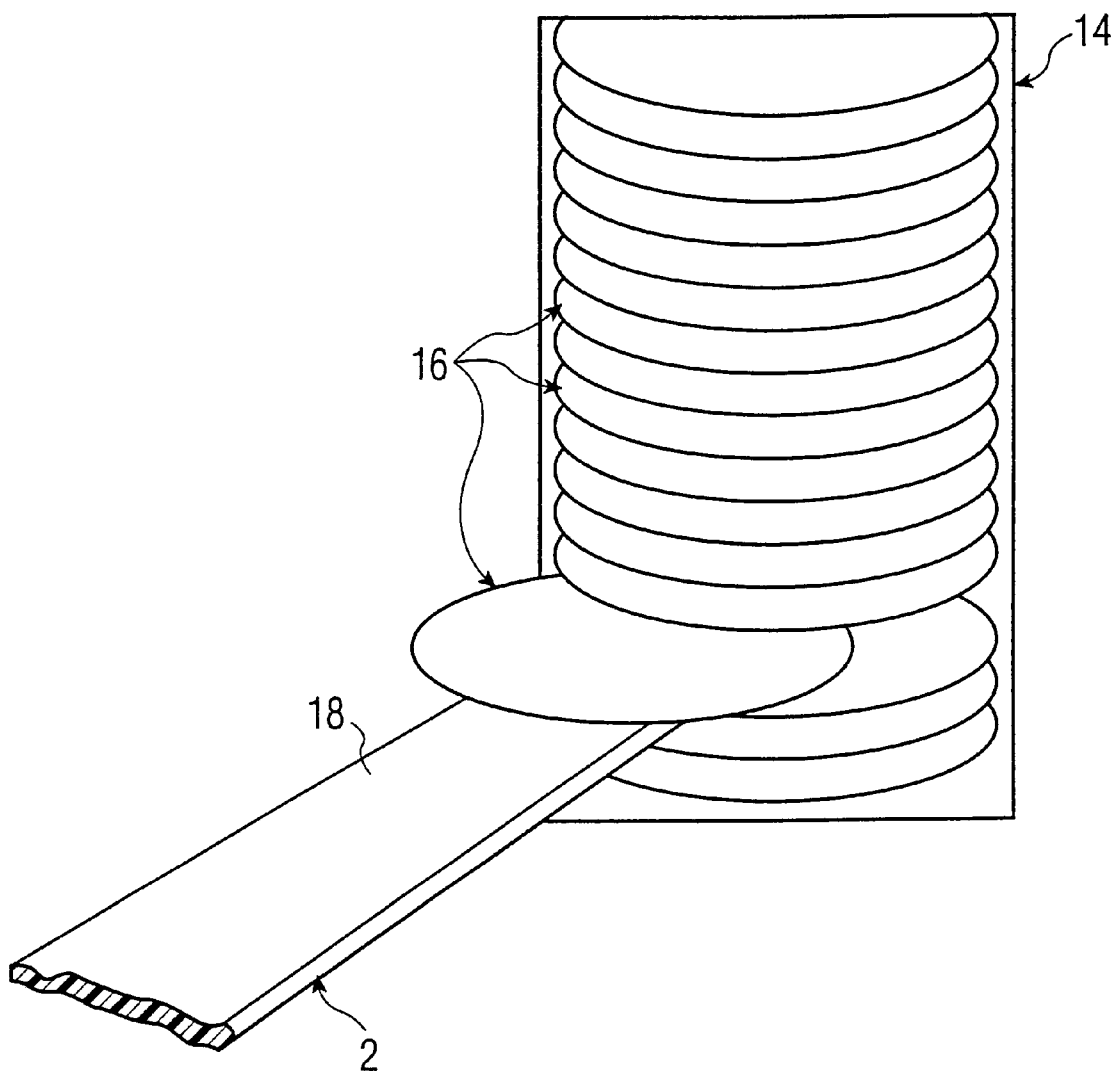
FIG. 2 illustrates the storage arrangement of a plurality of spaced-apart silicon wafers in a wafer storage cassette with a typical wafer transfer arm maneuvering therebetween to retrieve an individual semiconductor wafer.
Figure 3:
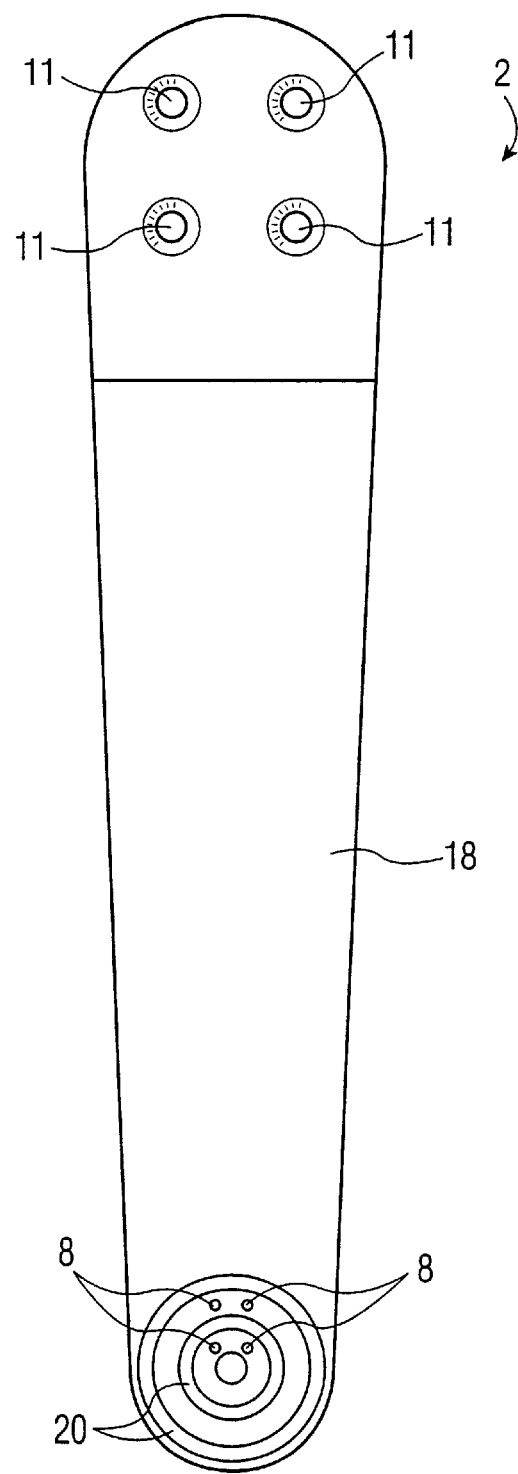
FIG. 3 is a top plan view of the prior art wafer transfer arm.

During wafer retrieval (see FIG. 2), the wafer transfer arm 2 maneuvers between the tight spaces between vertically stacked wafers 16 in a wafer storage cassette 14 to retrieve a selected one of the horizontally-oriented wafers 16. The wafer transfer arm 2 picks up the selected wafer 16 by touching the bottom surface of the selected wafer 16 with a top surface 18 of the arm 2 containing the vacuum outlets 8 (see FIG. 3), and applying a vacuum, so as to cause the wafer 16 to be sucked onto the wafer transfer arm 2. The top surface 18 of the arm 2 includes a pair of raised concentric annular bands 20 around the vacuum outlets 8 for supporting and focusing the vacuum suction securing the retained wafer 16 to the arm 2.

Figure 4:
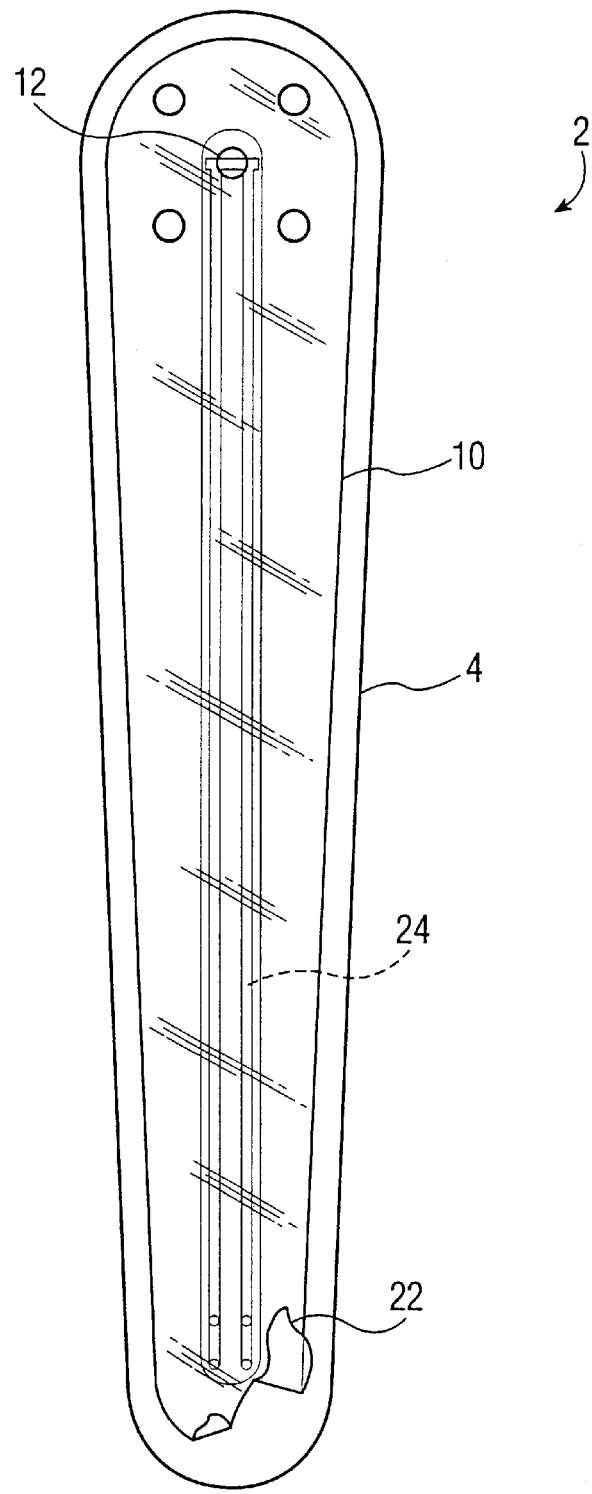
FIG. 4 is a bottom plan view of the prior art wafer transfer arm with a portion of a coverplate peeling back due to premature wear during use.

During operation, the wafer transfer arm 2 is typically exposed to high temperature, corrosive conditions and stresses related to the on/off cycling of the vacuum pressure. Over a period of time, the unfavorable conditions associated with semiconductor processing systems rapidly deteriorates the thin coverplate 10. Consequently, the coverplate 10 begins to loosen and separate from the body 4 as shown in FIG. 4. As more of the coverplate 10 separates, a loose portion 22 begins to pose a risk of grazing the surface of an adjacent underlying wafer 16 to a selected wafer 16, during retrieval of the latter, resulting in a scratching and other damage to the underlying wafer 16. Moreover, the loose or peeling portion 22 can also separate to a degree that compromises the gas-tight seal of the vacuum conduit 24 in the wafer transfer arm 2 eventually leading to a partial or total vacuum pressure loss, and results in the retained wafers 16 being dropped and damaged.

Figure 5:
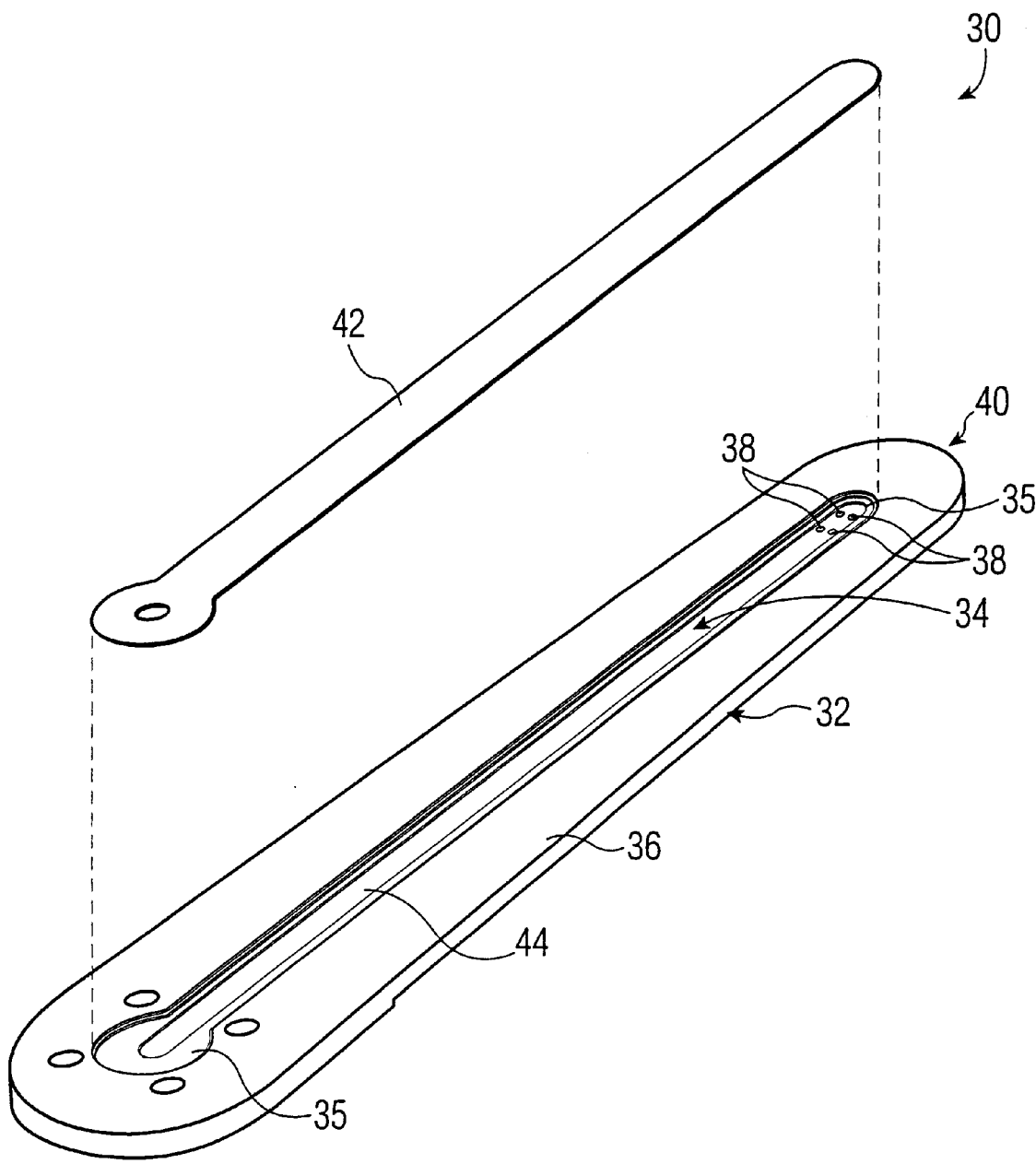
FIG. 5 is an exploded assembly view looking toward the bottom of a wafer transfer arm for one embodiment of the present invention.

Referring to FIG. 5, a wafer transfer arm 30 of the present invention includes a blade-like body 32 with a longitudinal channel 34 extending along a bottom surface 36, terminating in a plurality of vacuum outlets 38 at the distal end 40, and a coverplate 42 being configured for flush mating fit in a raised portion 35 of the channel 34 for defining a vacuum conduit 44 therein. The latter is formed in the lowest or most depressed portion of channel 34.

Both the body 32 and the coverplate 42 are preferably fabricated from a suitable machineable or moldable material capable of withstanding the hostile conditions associated with the fabrication, processing and handling of silicon wafers. Examples include ceramic material such as alumina, fused silica, MACOR®, boron nitride, beryllia, silicon nitride, boron carbide, aluminum nitride, silicon carbide, zirconia and the like; and plastic polymers such as DELRIN®, polycarbonate, fluorocarbons, polypropylene, polytetrafluoroethylene, acetals, polyvinylchloride, nylon, polyethylene and the like. It is also preferable to use the same or similar materials in fabricating the assembled body 32 and the coverplate 42 for establishing structural and chemical compatibility between the two components. It is further preferable for the wafer transfer arm 30 to include one or more coatings or layers of an insulating and self lubricating plastic polymer capable of withstanding high temperature operation, such as polytetrafluoroethylene (PTFE or TEFLON®), polyvinylidene fluoride (KYNAR®), chlorotrifluoroethylene, and FEP TEFLON®, for minimizing any scratching or marring of the surface of a semiconductor wafer 16 if contact occurs therebetween.

Figure 6:
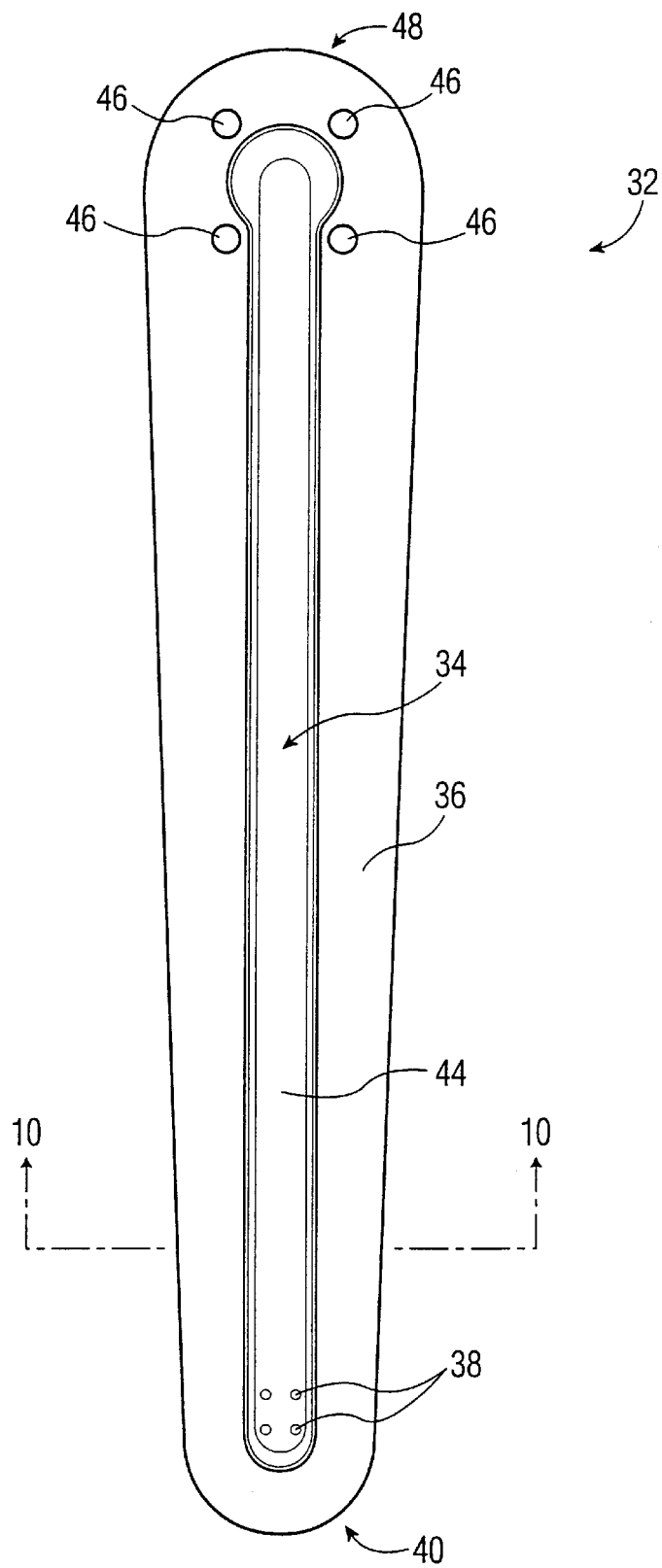
FIG. 6 is a bottom plan view of the wafer transfer arm absent a coverplate.
Figure 7:
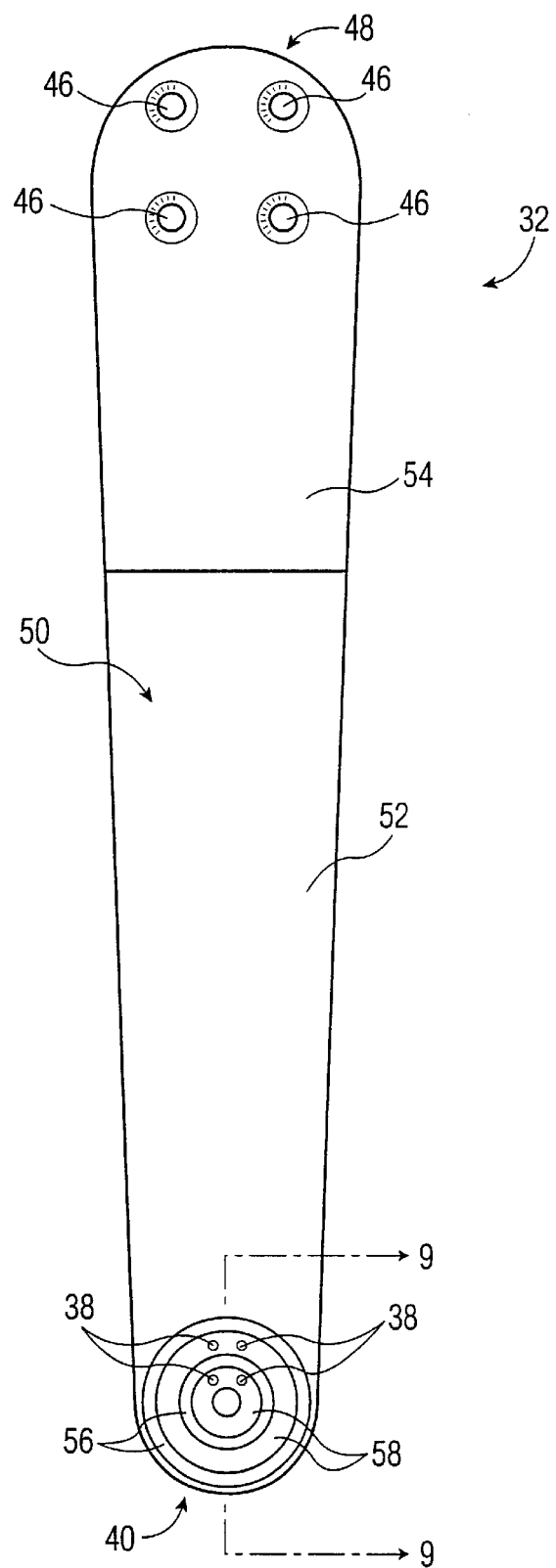
FIG. 7 is a top plan view of the wafer transfer arm.
Figure 8:
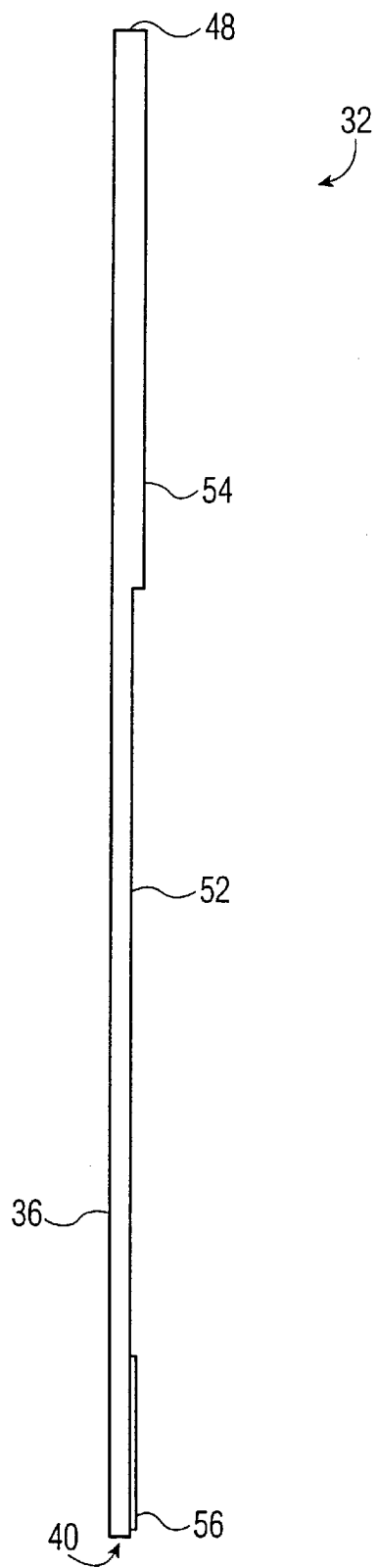
FIG. 8 is a side elevational view of the wafer transfer arm of FIG. 7.

Referring to FIGS. 6, 7 and 8, an embodiment of the body 32 is shown in various views. As shown specifically in FIGS. 6 and 7, the body 32 includes a plurality of mounting holes 46 at a proximal end 48 thereof for attachment with a wafer transfer apparatus (not shown). With the proximal end 48 being fixed to the apparatus (not shown), the distal end 40 is free to maneuver back and forth for transferring the wafers 16, as described. The body 32 further includes a top surface 50 (see FIG. 7) of arm portion 52 for receiving the bottom of the wafer 16 and a stepped-up portion 54 at the proximal end 48. The arm portion 52 provides a thin profile for permitting ample clearance between the stored wafers 16.

Figure 9:
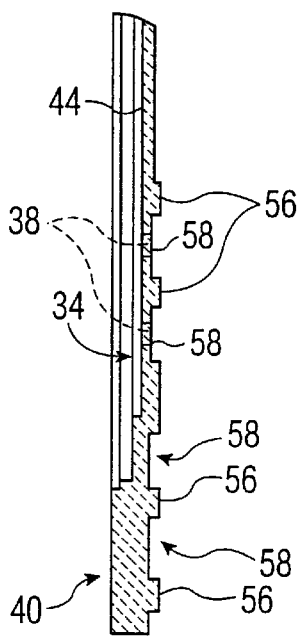
FIG. 9 is a cross sectional view of the wafer transfer arm taken along 9—9 of FIG. 7.

A pair of concentric annular ridges 56 is positioned on the top surface 50 proximate the distal end 40. The ridges 56 serve to contact and support the bottom of a wafer 16 during retrieval and transport. A pair of recesses 58, each located between the ridges 56, communicates with the vacuum outlets 38 of the vacuum conduit 44 as shown in FIG. 9. The recesses 58 provide the means to direct the vacuum suction drawn through the outlets 38 for securely retaining the wafer 16 on the ridges 56 by suction during retrieval and transport.

Figure 10:
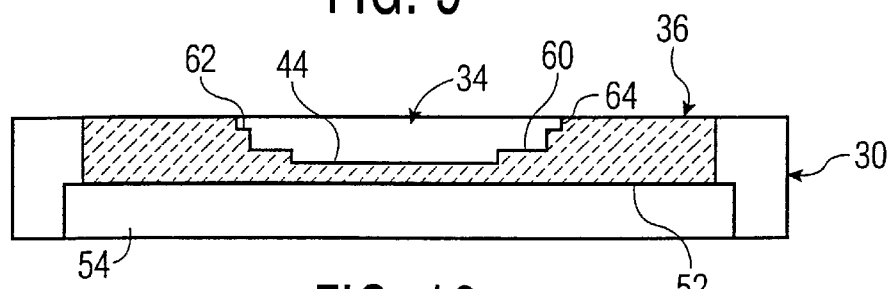
FIG. 10 is a cross sectional view of the wafer transfer arm taken along 10—10 of FIG. 6.

Referring to FIG. 10, the vacuum channel 34 includes a lower step 60 and an upper step 62, each extending along an inner periphery 64 thereof. The lower step 60 is configured to provide support for the coverplate 42, thereby defining and sealing the vacuum conduit 44 in the channel 34. The upper step 62 is configured to provide a gap formed in combination with the coverplate 42 for receiving an adhesive material to provide a bond therebetween as will be described hereinafter.

Figure 11:
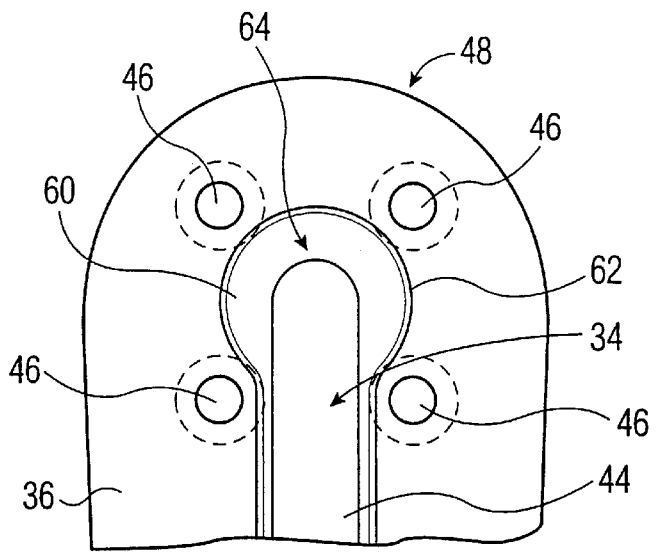
FIG. 11 is a detailed view of an end portion of the bottom of the wafer transfer arm.

Referring to FIG. 11, the proximal end 48 of the body 32 includes the mounting holes 46 and the vacuum channel 34 which terminates into a broader section 64. The proximal end 48 is subjected to increased structural stress associated with the operation of the wafer transfer apparatus connected thereto. The coverplate 42 being subjected to similar stress, is provided with additional support at the broader section 64. Accordingly, the lower step 60 is significantly wider in this section 64 than in section 34, and in this manner provides the increased support for the coverplate 42.

Figure 12:
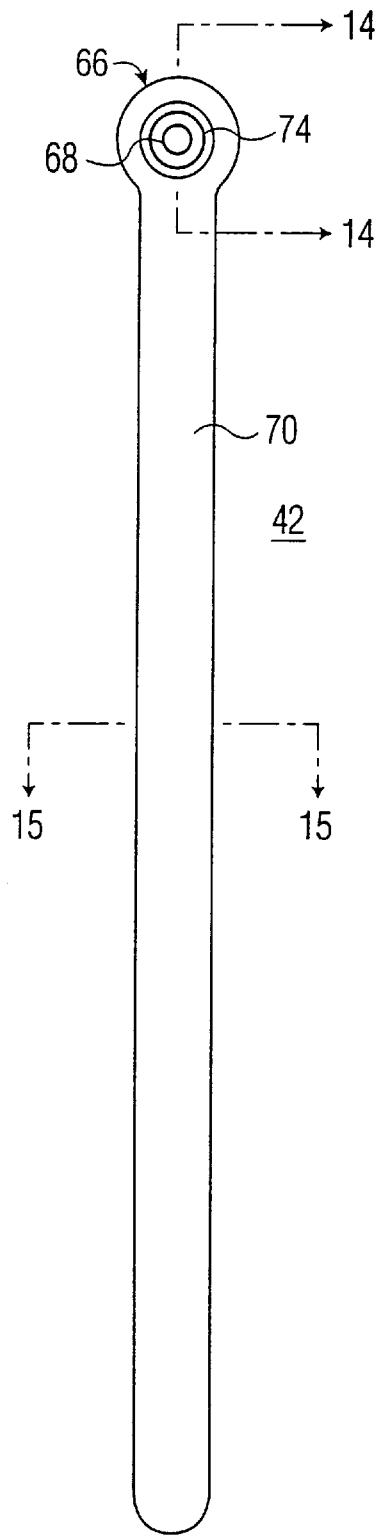
FIG. 12 is a bottom plan view of the coverplate for one embodiment of the invention.
Figure 13:
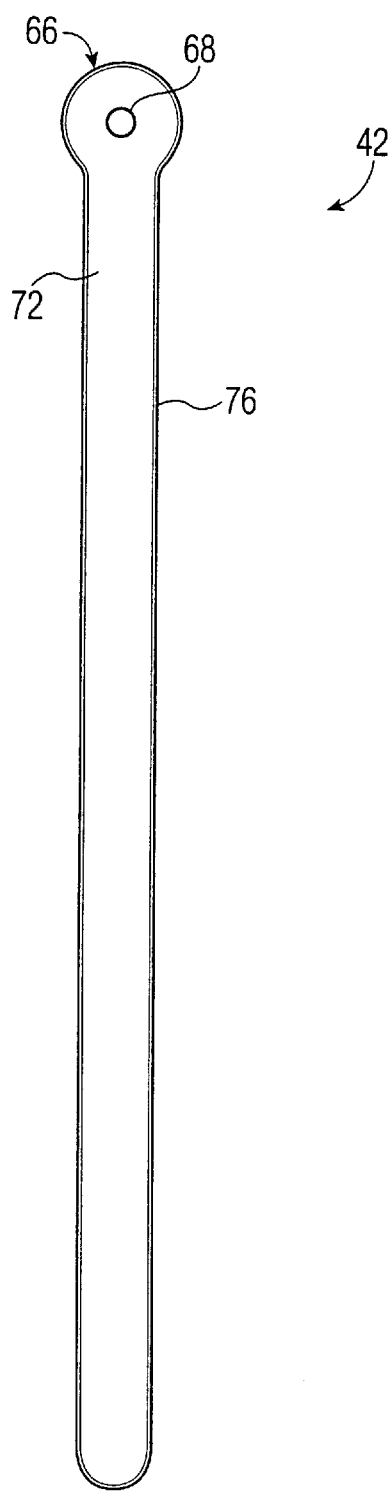
FIG. 13 is a top plan view of the coverplate.

Referring to FIGS. 12 and 13, the coverplate 42 is a slender tongue depressor-like slat configured to fit into the corresponding vacuum channel 34 of the body 32 to make a flush joint. The coverplate 42 includes a vacuum inlet 68, a head end 66 being expanded for fit into the broader section 64 of the channel 34 in the body 32, an inside surface 70 (see FIG. 12), and an outside surface 72 (see FIG. 13). In the assembled wafer transfer arm 30, the vacuum inlet 68 being in fluid communication with the vacuum conduit 44, is configured for coupling with a vacuum generating mechanism (not shown) of the wafer transfer apparatus (not shown).

Figure 14:
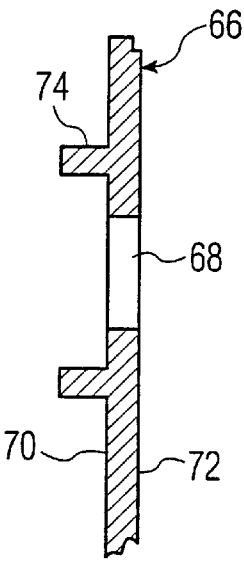
FIG. 14 is a cross sectional view of the coverplate taken along 14—14 of FIG. 12.

As shown in FIG. 12, the inside surface 70 includes an annular rib 74 extending around the vacuum inlet 68. The rib 74 projects away from the coverplate 42 as shown in FIG. 14 and snugly fits into lower step 60 of the channel 34 for additional structural reinforcement and retainment of the coverplate 42 therein.

Figure 15:
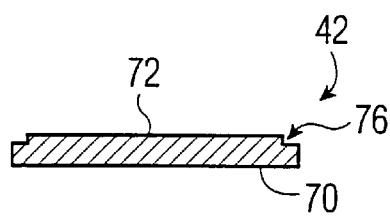
FIG. 15 is a cross sectional view of the coverplate taken along 15—15 of FIG. 12.
Figure 16:
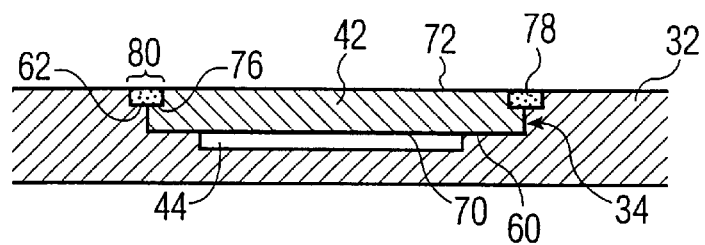
FIG. 16 is a cross sectional assembly view of the coverplate in place on the wafer transfer arm for one embodiment of the invention.
Figure 17:
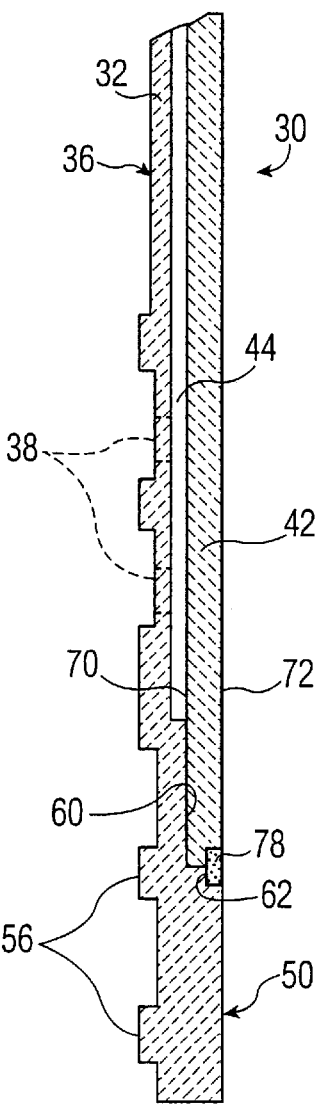
FIG. 17 is a partial longitudinal cross sectional view through the center of the wafer transfer arm with the coverplate installed for one embodiment of the invention.

Referring to FIG. 15, the coverplate 42 includes a stepped-down portion 76 along the edge of the outside surface 72 (see also FIG. 13). Similar to the upper step 62 of the body 32, the stepped-down portion 76 of the coverplate 42 provides a spacing to receive adhesive material for affixing the coverplate 42 to the body 32. As shown specifically in FIG. 16, the coverplate 42 is fixed to the channel 34 of the body 32 by an adhesive substance 78 suitable for withstanding the hostile conditions associated with the fabrication, processing and handling of silicon wafers, such as silicates, furane resins, sulfur-based resins, phenolic resins, epoxies, urethanes, cyanoacrylates, anaerobics, rubber, silicone, polysulfides, polyester, fiberglass, UV-curing types, moisture curing types and the like, deposited in the groove 80 formed by the upper step 62 of the body 32 and the stepped portion 76 of the coverplate 42. Referring to FIG. 17, a cross sectional view of the of the wafer transfer arm 30 is shown to illustrate the vacuum conduit 44 being sealed by the coverplate 42 and providing fluid communication between the outlets 38 and inlet 68, and the relative positions of the outlets 38 with the annular ridges 56 and recesses 58.

Figure 18:
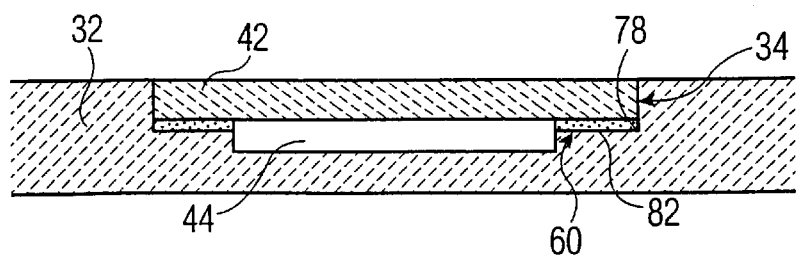
FIG. 18 is a cross sectional assembly view of the coverplate in place in the wafer transfer arm for an alternative embodiment of the invention.

Referring to FIG. 18, an alternative embodiment of the present invention is shown. In this embodiment, the placement of the adhesive substance differs from the previous embodiment. The adhesive substance is located between the coverplate 42 and the upper surface 82 of the lower step 60 along the inside periphery of the channel 34. In the alternative embodiment, the coverplate 42 will not have a stepped-down portion 76 as shown in FIG. 15, and will be rectangular for the cross section shown.

Although various embodiments of the invention have been shown and described, they are not meant to be limiting. Those of skill in the art may recognize various modifications to these embodiments, which modifications are meant to be covered by the spirit and scope of the appended claims.

What is claimed is:

1. A wafer transfer arm comprising:
   a blade having first and second ends, top and bottom portions, said first end being configured for attachment to a wafer transfer apparatus;
   said top portion of said blade including a top surface being configured for receiving a substrate wafer thereon, and a suctional mechanism proximate said second end being configured for releasable retainment of said substrate wafer;
   a longitudinal channel extending along said bottom portion from said first end to said second end, said channel being in fluid communication with said suctional mechanism;
   a coverplate being configured for a flush sealed fit within a top portion of said channel to form a vacuum conduit therein, said coverplate having a vacuum outlet proximate said first end of said blade, said vacuum outlet being configured for fluid coupling with a vacuum-generating mechanism; and
   an affixing mechanism for securably affixing said coverplate to said blade, said affixing mechanism including an adhesive substance.

2. The wafer transfer arm of claim 1 wherein said suctional mechanism includes one or more suction ports for holding said substrate wafer during pick up and transfer.

3. The wafer transfer arm of claim 2 wherein said suctional mechanism further includes one or more concentric raised annular ribs with said suction ports residing therebetween.

4. The wafer transfer arm of claim 1, wherein said substrate wafer is composed of a semiconductor material.

5. The wafer transfer arm of claim 1, wherein said blade and coverplate are composed of a machineable or moldable material.

6. The wafer transfer arm of claim 5 wherein said blade and coverplate are composed of the same material.

7. The wafer transfer arm of claim 5, wherein said material is ceramic.

8. The wafer transfer arm of claim 7 wherein said ceramic is selected from the group consisting of alumina, fused silica, MACOR®, boron nitride, beryllia, silicon nitride, boron carbide, aluminum nitride, silicon carbide, zirconia and compounds thereof.

9. The wafer transfer arm of claim 5, wherein said material is a molded or machined plastic polymer.

10. The wafer transfer arm of claim 9 wherein said plastic polymer is selected from the group consisting of DELRIN, nylon, polytetrafluoroethylene, polyvinylchloride, fluorocarbons, polycarbonate, polypropylene, polyethylene, acetals and compounds thereof.

11. The wafer transfer arm of claim 1, further including one or more coatings of an insulating and self lubricating plastic polymer capable of withstanding high temperature operation, upon at least outer surfaces of said blade, and said coverplate, respectively.

12. The wafer transfer arm of claim 11, wherein said insulating and self lubricating plastic polymer is selected from the group consisting of polyvinylidene fluoride, chlorotrifluoroethylene, polytetrafluoroethylene, FEP resin, and compounds thereof.

13. The wafer transfer arm of claim 1, wherein said adhesive substance is selected from the group consisting of silicates, furane resins, sulfur-based resins, phenolic resins, cyanoacrylates, epoxies, urethanes, anaerobics, rubber, silicone, polysulfides, polyester, fiberglass, and compounds thereof.

14. The wafer transfer arm of claim 1, wherein said top surface proximate said first end includes a stepped portion.

15. The wafer transfer arm of claim 1, further including a raised platform extending along an inside sidewall of said channel for further defining said vacuum conduit and supporting said coverplate.

16. The wafer transfer arm of claim 15, wherein said affixing mechanism includes said adhesive substance provided in a layer between a face of said platform and adjacent mating surface of said coverplate.

17. The wafer transfer arm of claim 15, wherein:
said coverplate further includes a stepped edge along an external periphery thereof; and
said channel includes a stepped edge along an external periphery thereof.

18. The wafer transfer arm of claim 17, wherein said adhesive substance is applied to a groove formed by the stepped edges of the fitted coverplate, and blade, respectively.

19. A wafer transfer arm comprising:
a blade having first and second ends, top and bottom portions, said first end being configured for attachment to a wafer transfer apparatus;
said top portion of said blade including a top surface being configured for receiving a substrate wafer thereon, and a suctional mechanism proximate said second end being configured for releasable retainment of said substrate wafer;
a longitudinal channel extending along a recessed portion of said bottom portion from said first end to said second end, said channel including a base portion, a lower step about said base portion, and an upper step about said lower step, said channel being in fluid communication with said suctional mechanism;
a coverplate being configured for a flush sealed fit with said bottom portion within a top portion of said channel on said upper step to form a vacuum conduit therein, said coverplate having a vacuum outlet proximate said first end of said blade, said vacuum outlet being configured for fluid coupling with a vacuum-generating mechanism; and
an affixing mechanism for securably affixing said coverplate to said blade.

20. The wafer transfer arm of claim 19, wherein said suctional mechanism includes one or more suction ports for holding said substrate wafer during pick up and transfer.

21. The wafer transfer arm of claim 20, wherein said suctional mechanism further includes one or more concentric raised annular ribs with said suction ports residing therebetween.

22. The wafer transfer arm of claim 19, wherein said substrate wafer is composed of a semiconductor material.

23. The wafer transfer arm of claim 19, wherein said blade and coverplate are composed of a machineable or moldable material.

24. The wafer transfer arm of claim 23, wherein said blade and coverplate are composed of the same material.

25. The wafer transfer arm of claim 23, wherein said material is ceramic.

26. The wafer transfer arm of claim 25, wherein said ceramic is selected from the group consisting of alumina, fused silica, MACOR®, boron nitride, beryllia, silicon nitride, boron carbide, aluminum nitride, silicon carbide, zirconia and compounds thereof.

27. The wafer transfer arm of claim 23, wherein said material is a molded or machined plastic polymer.

28. The wafer transfer arm of claim 27, wherein said plastic polymer is selected from the group consisting of DELRIN, nylon, polytetrafluoroethylene, polyvinylchloride, fluorocarbons, polycarbonate, polypropylene, polyethylene, acetals and compounds thereof.

29. The wafer transfer arm of claim 19, further including one or more coatings of an insulating and self lubricating plastic polymer capable of withstanding high temperature operation, upon at least outer surfaces of said blade, and said coverplate, respectively.

30. The wafer transfer arm of claim 29, wherein said insulating and self lubricating plastic polymer is selected from the group consisting of polyvinylidene fluoride, chlorotrifluoroethylene, polytetrafluoroethylene, FEP resin, and compounds thereof.

31. The wafer transfer arm of claim 19, wherein said affixing mechanism includes an adhesive substance.

32. The wafer transfer arm of claim 31, wherein said adhesive substance is selected from the group consisting of silicates, furane resins, sulfur-based resins, phenolic resins, cyanoacrylates, epoxies, urethanes, anaerobics, rubber, silicone, polysulfides, polyester, fiberglass, and compounds thereof.

33. The wafer transfer arm of claim 19, wherein said top surface proximate said first end includes a stepped portion.

34. The wafer transfer arm of claim 19, further including a raised platform extending along an inside sidewall of said channel for further defining said vacuum conduit and supporting said coverplate.

35. The wafer transfer arm of claim 34, wherein said affixing mechanism includes an adhesive layer between a face of said platform and adjacent mating surface of said coverplate.

36. The wafer transfer arm of claim 34, wherein:
said coverplate further includes a stepped edge along an external periphery thereof; and said channel includes a stepped edge along an external periphery thereof.

37. The wafer transfer arm of claim 36, wherein said affixing mechanism includes an adhesive substance applied to a groove formed by the stepped edges of the fitted coverplate, and blade, respectively.

* * * * *